United States Patent [19]

Marinelli

[11] Patent Number: 4,569,077
[45] Date of Patent: Feb. 4, 1986

[54] TRANSDUCER MOUNTING ASSEMBLY

[76] Inventor: Anthony Marinelli, P.O. Box 7328, New Castle, Pa. 16107

[21] Appl. No.: 567,165

[22] Filed: Dec. 30, 1983

[51] Int. Cl.[4] .......................... H04R 1/04; H04R 1/46
[52] U.S. Cl. ...................................... 381/113; 381/88; 381/91; 381/122; 84/DIG. 24; 310/328; 310/334
[58] Field of Search ................. 84/DIG. 24; 310/323, 310/328, 334; 381/118, 87, 88, 91, 113, 114, 122

[56] References Cited

U.S. PATENT DOCUMENTS

| | | | |
|---|---|---|---|
| 3,305,638 | 2/1967 | Teachout | 381/113 |
| 3,496,297 | 2/1970 | Brumberger | 381/118 |
| 3,604,853 | 9/1971 | Piess | 381/91 |
| 4,061,934 | 12/1977 | Rowe | 310/323 |
| 4,160,401 | 7/1979 | Tomioka | 84/DIG. 24 |

*Primary Examiner*—Howard A. Birmiel
*Attorney, Agent, or Firm*—Harvey B. Jacobson

[57] ABSTRACT

A transducer rendered operative by a battery voltage source is mounted on and closely spaced from a sonic radiating surface by a sonic coupling body to which a housing is secured in enclosing relation to both the transducer and the battery source. Openings in the housing expose a volume control knob and an output signal jack through which a signal cable connects the transducer to a remotely located amplifier.

18 Claims, 6 Drawing Figures

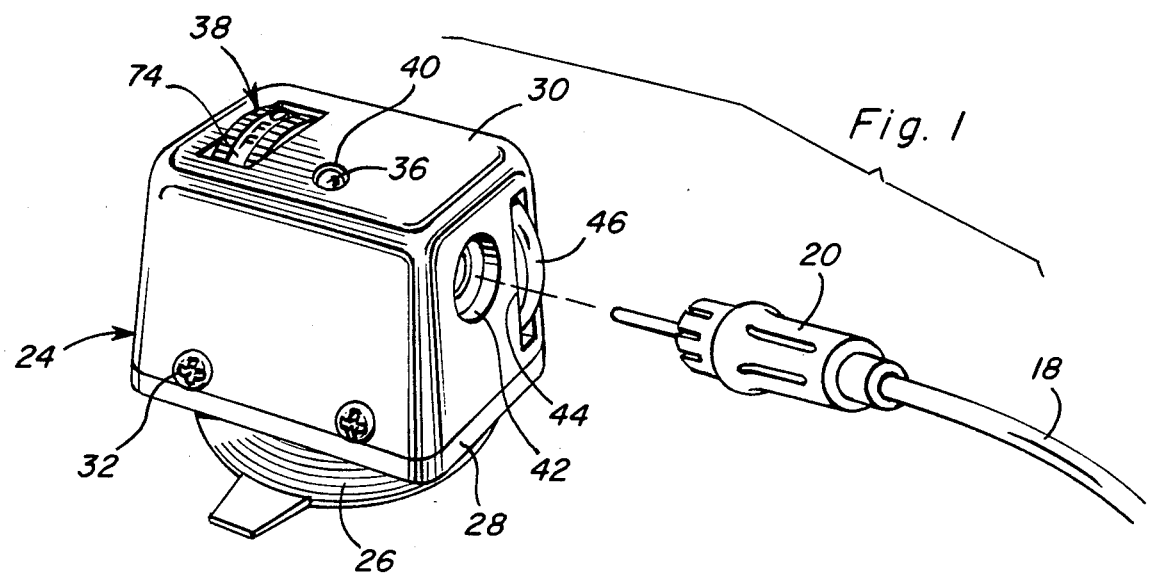
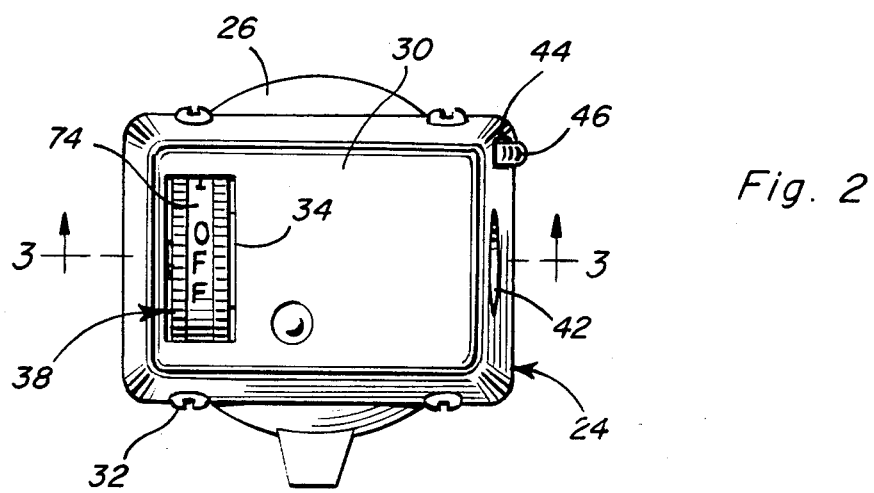
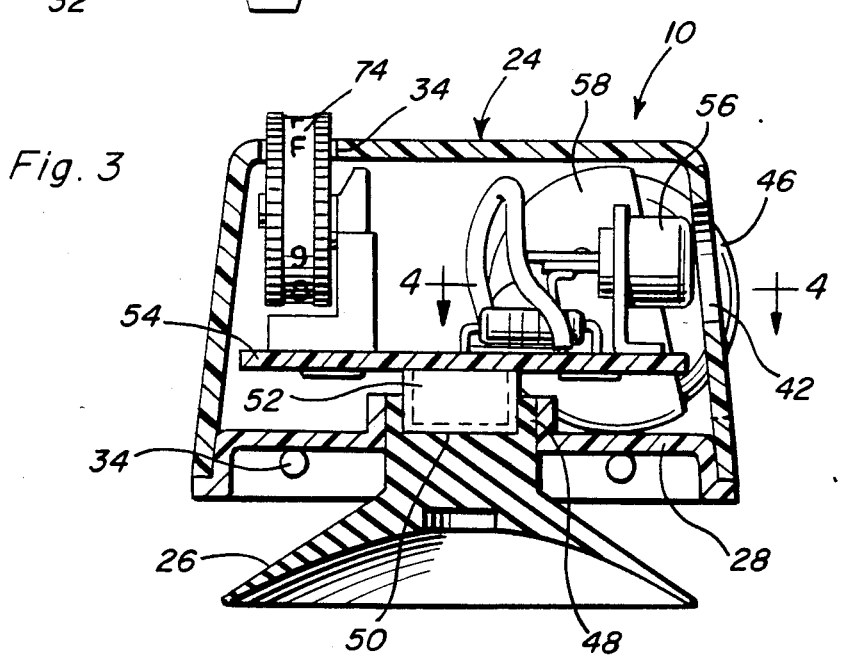

TRANSDUCER MOUNTING ASSEMBLY

BACKGROUND OF THE INVENTION

This invention relates in general to sound amplification and more particularly to coupling and mounting arrangements for sonic transducers feeding signals to audio amplifiers.

The mounting of sonic transducers on radiating surfaces for sound pick up and amplification purposes is generally well known whether it be for medical reasons on human beings, for reproduction of musical tones, for sonic testing materials, or for measurement of fluid flow in conduits. The use of suction cup devices to removably hold a transducer on a radiating surface is also well known as disclosed, for example, in U.S. Pat. No. 2,752,914 to Pohlman and U.S. Pat. No. 3,496,297 to Brumberger. Further, the use of elastomeric material to hold the transducer in spaced relation to the radiating surface as part of a sonic coupling arrangement is disclosed in each of U.S. Pat. Nos. 3,394,586 and 4,279,167 to Cross and Erb et al, respectively. According to both of the latter two patents, the sonic transducer is mounted within a recess or cavity formed in the coupling body, the entire coupling body being made of elastomeric material in the case of the Cross patent.

The foregoing prior art includes use of sonic coupling and mounting arrangements for transducers on the radiating surface of a musical instrument as the sound generating device in order to faithfully amplify and reproduce musical tones. For such installations, the use of a condenser microphone type of transducer has been proposed because of its known characteristics. However, the use of a condenser microphone type of transducer for such purpose requires a source of electrical voltage as well as output voltage control. The mounting of such transducers in one assembly with its associated circuitry, controls and battery power source as an independent portable unit, is also known as disclosed in U.S. Pat. No. 3,305,638 to Teachout. However, because of the mounting of such transducer directly on the radiating surface of a sound generator and the desire to avoid disturbing the sensitivity of the transducer, the voltage source and control was deemed to be most logically located remote from the transducer to which it would be coupled by conductors of suitable length.

SUMMARY OF THE INVENTION

An important discovery of the present invention resides in the unexpected satisfactory performance of the condenser microphone type of transducer when housed together with the power source and voltage control directly on the transducer coupling body for direct vibration transmission at a mounting location on the radiating surface. The housing construction and its relationship to the power source, the voltage control, the transducer and the sonic coupling body are critical to not only provide unexpected quality pick-up for faithful reproduction of musical tones but to also provide cost effective and compact hardware.

In accordance with the invention, the housing includes a base secured to the elastomer coupling body closely spaced by its suction cup formation from a solid radiating surface. The transducer is seated in a recess formed in the coupling body and projects therefrom into a cover portion of the housing secured to the housing base to enclose a single protective chamber. A printed circuit board is fixed to the projecting portion of the transducer and mounts the operating circuit electrically connecting the transducer to a flat disc battery-type of voltage source, a voltage or volume control device associated with an on-off switch, an LED indicator and an output terminal jack. All of such circuit components are supported on the circuit board and are exposed through openings formed in the cover portion of the housing to enable adjustment of the volume control device, plug in of a signal cable to the jack and emission of light from the LED indicator. An access slot in the housing cover exposes a portion of the disc battery yieldably retained in a holder also enclosed by the cover to accommodate insertion and removal of the battery for replacement purposes without disassembly of the housing.

These together with other objects and advantages which will become subsequently apparent reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

FIG. 1 is a persective view of a sonic pick-up transducer assembly in accordance with the present invention.

FIG. 2 is a top plan view of the assembly shown in FIG. 1.

FIG. 3 is a sectional view taken substantially through a plane indicated by section line 3—3 in FIG. 2.

DETAILED DESCRIPTION OF THE PREFERRED EMBODIMENT

Figure 6:
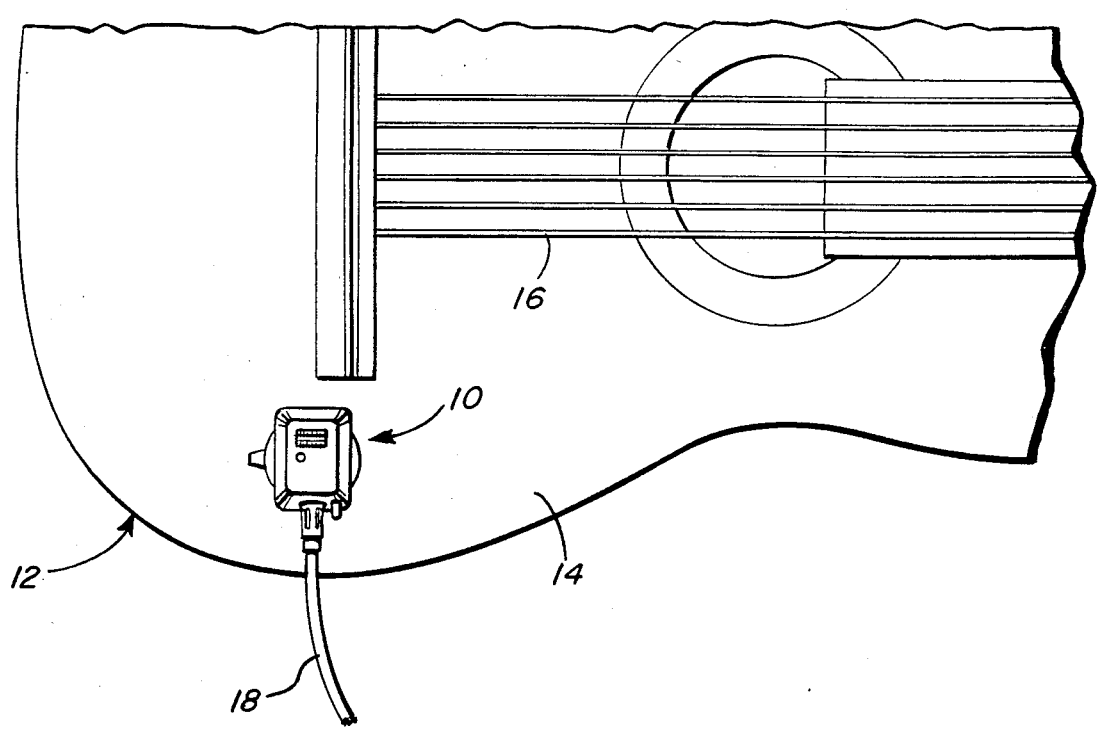
FIG. 6 is a partial top plan view showing a typical installation for the transducer assembly.

Referring now to the drawings in detail, FIG. 1 illustrates a transducer assembly, generally referred to by reference numeral 10. The assembly is typically mounted on a musical instrument such as the guitar 12 shown in FIG. 6 in order to pick up contact vibrations from the exterior solid surface 14 and adequate sound pressure disturbances, both directly and internally resonated, as a result of the generation of musical sounds by plucking of the guitar strings 16. The signal output of the transducer assembly is directly transmitted to an amplifier through a signal conductor cable 18 having a commercially available type of plug-in connector 20 at one end adapted to be inserted into the transducer assembly as shown in FIG. 1.

The transducer assembly includes an elastomeric coupling body generally referred to by reference numeral 22 to which a housing 24 is directly secured. A vinyl plastic type of material may be utilized for the coupling body which includes a flexible suction cup formation 26 adapted to be pressed onto a sonic radiating surface such as surface 14 in order to removably hold the assembly 10 thereon by suction pressure in a manner well known in the art. The housing 25 includes a base portion 28 secured to the coupling body and a cover portion 30 secured by fasteners 32 to the base portion. As shown in FIGS. 1 and 2, the cover portion is somewhat trapezoidal in side elevation having a top face parallel spaced from the base 28 and provided with an opening 34 exposing a control knob 74 of a volume control device 38 and an opening 36 exposing an indicator 40. One end face of the cover as shown is provided with a circular opening 42 adapted to receive the plug-in connector 20 of the signal output cable 18. Also provided in the same end face of the cover is an elongated access slot 44 through which a flat disc type of battery 46 projects.

Referring now to FIG. 3 in particular, the suction cup formation 26 is formed integrally with a cylindrical portion 48 of the coupling body 22 extending into the housing through an opening in the base 28 to which the coupling body is secured. A cavity or recess 50 is formed in the coupling body as shown to seat a transducer 52, such as a miniature condenser microphone of a commercially available type. The microphone projects from the coupling body and is electrically connected to an operating circuit mounted on a printed circuit board 54 to which the microphone is secured on the underside. Also secured to the circuit board on its side opposite the microphone is the volume control device 38 and an output signal jack 56 of a commercially available type. The jack is axially aligned with the opening 42 in the housing cover 30 in order to receive the plug-in connector 20 aforementioned, and is wired to the operating circuit on the circuit board 54.

Figure 4:
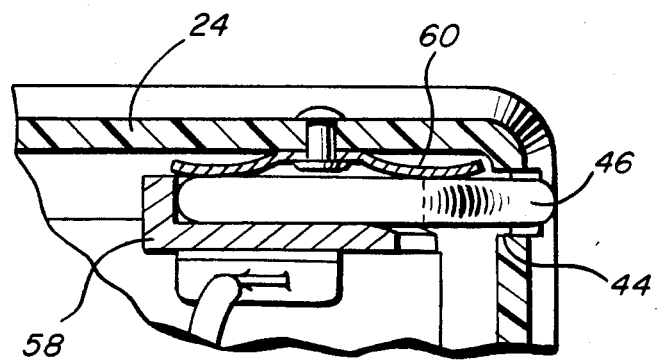
FIG. 4 is an enlarged partial sectional view taken substantially through a plane indicated by section line 4—4 in FIG. 3.

As more clearly seen in FIG. 4, a battery holder 58 is secured to and enclosed in the cover 30. The holder is shaped to receive the disc battery 46 and has a chordal opening aligned with the access slot 44 through which the battery is inserted. A leaf spring element 60 yieldably holds the battery in operative position engaging contacts wired to the operating circuit on the printed board 54.

Figure 5:
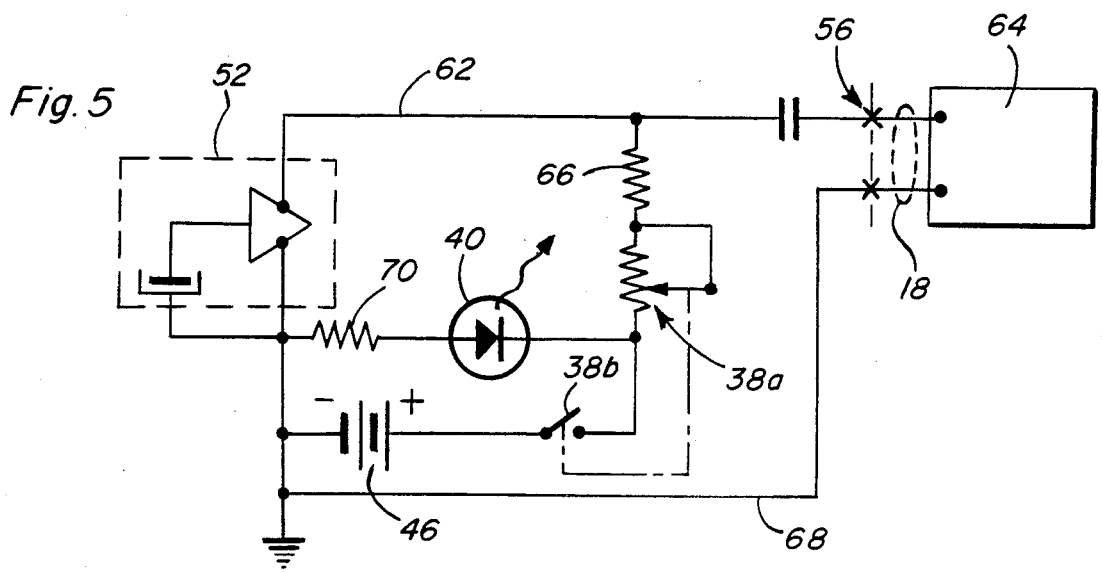
FIG. 5 is a circuit diagram conforming to the operating circuit associated with the transducer assembly of the present invention.

The operating circuit is diagrammed in FIG. 5 which shows the condenser microphone component 52 having a signal voltage output line 62 coupled through jack 56 to the signal cable 18 adapted to be plugged into a remotely located amplifier 64. The positive terminal of the battery 46 is connected through a load resister 66 and adjustable resistor 38a of the volume control 38 to line 62 upon closing of an on-off switch 38b associated with the volume control device. The negative terminal of battery 46 is electrically connected to a ground line 68 interconnected between the microphone 52 and cable 18 through jack 56. The indicator 40 is of the LED type and is electrically interconnected in series with load resistor 70 between ground line 68 and junction 72 between the series connected switch 38b and adjustable resistor 38a of the volume control device 38. Thus, upon closing of the switch 38b, and displacement of the adjustable resistor 38a by control knob 74 from a maximum load position to an operating position, the indicator 40 will emit light to signify the operating condition of the transducer assembly directly at its mounting location. The disposition of the control knob 74 and indicator 40 on the top face of the housing cover facilitates control and convenient display of the indicator.

These together with other objects and advantages which will become subsequently apparent reside in the details of construction and operation as more fully hereinafter described and claimed, reference being had to the accompanying drawings forming a part hereof, wherein like numerals refer to like parts throughout.

What is claimed as new is as follows:

1. In combination with an electrically powered condenser microphone, a power source rendering the microphone operative to generate an output signal in response to detection of sonic vibration of a radiating surface, and an elastomeric body removably mounted in contact with said surface holding the microphone in spaced relation thereto, the improvement comprising coupling means directly mounting the microphone in the body for direct coupled vibration transmission between the radiating surface and the microphone and a housing directly secured to said body and enclosing a protective chamber and means mounting the power source within the chamber of the housing in non-isolated relation to the microphone.

2. The improvement as defined in claim 1 wherein said housing includes a base mounted in spaced relation to the surface by the elastomeric body and a cover mounted on the base to form the chamber in enclosing relation to the power source.

3. The improvement as defined in claim 2 further including a circuit board secured to the transducer within the chamber 00, an output signal jack mounted on the circuit board, a volume control device mounted on the circuit board, and operating circuit means on the circuit board for electrically interconnecting the power source, the jack and the volume control device, the cover having openings through which the jack is exposed and through which the volume control device projects externally of the cover.

4. The improvement as defined in claim 3 wherein the power source is a disc battery and a holder secured to the cover within which the battery is held in operative relation to the circuit means, the cover having an access slot through which the battery is inserted and removed from the holder.

5. The improvement as defined in claim 2 wherein the power source is a disc battery and a holder secured to the cover within which the battery is held in operative relation to the circuit means, the cover having an access slot through which the battery is inserted and removed from the holder.

6. The improvement as defined in claim 4 wherein the cover includes a face portion within which one of the openings is formed to expose the volume control device and an end portion within which the other of the openings is formed to expose the jack.

7. The improvement as defined in claim 6 including indicator means mounted on the face portion of the cover and connected to the operating circuit means for signifying operation of the transducer.

8. The improvement as defined in claim 7 wherein the access slot is formed in the end portion of the cover.

9. The improvement as defined in claim 3 wherein the cover includes a face portion within which one of the openings is formed to expose the volume control device and an end portion within which the other of the openings is formed to expose the jack.

10. In combination with a transducer, a sonic coupling body having a cavity within which the transducer is mounted, a voltage source, circuit means operatively connecting the source to the transducer for operation thereof and terminal means connected to the circuit means for conducting a signal output of the transducer, the improvement comprising a housing mounted on the coupling body to form a single chamber enclosing the transducer, the source, the circuit means and the terminal means in non-isolated relation to each other, said circuit means having a control device and said housing having at least two openings through which the control device projects from the chamber and through which the terminal means is exposed externally of the chamber.

11. The improvement as defined in claim 10 including a holder enclosed within the housing, the housing having an access slot through which the voltage source is inserted into and removed from the holder.

12. The combination as defined in claim 10 wherein the transducer is a condenser microphone adapted to pick up sounds transmitted through a sonic radiating surface on which the coupling body is mounted.

13. The combination of claim 12 including elastomeric means for removably holding the sonic coupling body on said surface.

14. The combination of claim 13 wherein said elastomeric means is a suction cup device.

15. In a sonic coupling between an electrically powered transducer associated with an operating battery and a radiating surface of a sound generating device, including a coupling body having a cavity formed therein between the transducer and the surface and elastomeric means for holding the body in direct vibration coupled contact with the surface, the improvement comprising a housing directly secured to the body and having a single chamber enclosing the transducer, and means mounting the battery in non-isolated relation to the transducer within said chamber of the housing for operation of the transducer.

16. The sonic coupling as defined in claim 15 wherein the transducer is seated within the cavity formed in the coupling body.

17. In a coupling between a radiating surface of a sound generating device and a transducer powered by a battery, an elastomeric body having a cavity within which the transducer is mounted and suction cup means adhering to the surface for direct vibration transmission between the surface and the transducer, the improvement comprising a base secured to the elastomeric body in close spaced relation to the suction cup means, a cover secured to the base enclosing a single protective housing chamber, said transducer projecting from the cavity in the body into the chamber, a circuit board secured to the transducer within the chamber, circuit means mounted on the circuit board within the chamber and electrically connected to the battery and the transducer for generating an output signal faithfully reproducing sounds radiated from said surface, and means mounted within said chamber for holding the battery therein in non-isolated relation to the transducer and the circuit means, said circuit means having a plurality of components exposed from the chamber through openings in the cover.

18. The improvement as defined in claim 17 wherein said components of the circuit means consist of a cable coupling jack, a volume control device and an indicator.

* * * * *